(12) United States Patent
Kozu et al.

(10) Patent No.: US 6,315,633 B1
(45) Date of Patent: *Nov. 13, 2001

(54) PROCESSING JIG (75) Inventors: Masaki Kozu; Masahiro Sasaki; Noboru Kanzo, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/495,172

(22) Filed: Feb. 1, 2000

Related U.S. Application Data (63) Continuation-in-part of application No. 09/106,135, filed on Jun. 29, 1998, now Pat. No. 6,050,878, and a continuation-in-part of application No. 29/102,214, filed on Mar. 19, 1999, now Pat. No. Des. 427,615.

(30) Foreign Application Priority Data

Jun. 25, 1998 (JP) .................................... 10-178949
Mar. 11, 1999 (JP) .................................... 11-005980

(51) Int. Cl.⁷ ..................................................... B25B 49/00
(52) U.S. Cl. ............................. 451/5; 29/603.16; 451/11; 451/405
(58) Field of Search ................................. 451/5, 1, 405, 451/364; 269/266, 22; 29/603.16

(56) References Cited

U.S. PATENT DOCUMENTS

| 4,914,868 | 4/1990 | Church et al. . |
| 5,468,177 | 11/1995 | Kindler et al. . |
| 5,525,091 | 6/1996 | Lam et al. . |
| 5,607,340 | 3/1997 | Lackey et al. . |
| 5,620,356 | 4/1997 | Lacket . |
| 5,816,890 | 10/1998 | Hao et al. . |
| 6,050,878 | * 4/2000 | Kanzo et al. ............................ 451/5 |

FOREIGN PATENT DOCUMENTS

| Hei 2-95572 | 4/1990 | (JP) . |
| WO 94/17959 | 8/1994 | (WO) . |

* cited by examiner

Primary Examiner—Joseph J. Hail, III
Assistant Examiner—Daniel Shanley
(74) Attorney, Agent, or Firm—Oliff & Berridge, PLC

(57) ABSTRACT

A processing jig of the invention is provided for deforming an object to be processed that is long in one direction into a complicated shape and processing the object with accuracy. The jig comprises: a main body to be fixed to a processing apparatus; a retainer that is long in one direction for retaining a bar as the object long in one direction; four couplers for coupling the retainer to the main body; five load application sections, coupled to the retainer, to which a load is applied for deforming the retainer; and arms for coupling the load application sections to the retainer.

2 Claims, 7 Drawing Sheets

PROCESSING JIG

This is a Continuation-in-Part of Applications Ser. Nos. 09/106,135 and 29/102,214 filed Jun. 29, 1998 now U.S. Pat. No. 6,050,878 and Mar. 19, 1999 now U.S. Pat. No. D 427,615. The entire disclosure of the prior applications is hereby incorporated by reference herein in its entirety.

BACKGROUND OF THE INVENTION

1. Field of the Invention

The present invention relates to a processing jig for holding an object processed with a processing apparatus.

2. Description of the Related Art

A flying-type thin film magnetic head used for a magnetic disk device and so on is generally made up of a slider and a magnetic head element provided at the trailing edge of the slider. The slider generally comprises a rail whose surface functions as a medium facing surface (an air bearing surface) and a tapered section or a step near the end on the air inflow side. The rail flies slightly above the surface of a recording medium such as a magnetic disk by means of air flow from the tapered section or step.

A thin film head element generally used is a composite-type element made up of layers of an induction-type magnetic transducer for writing and a magnetoresistive (MR) element for reading.

In general, such thin film magnetic heads are formed through cutting a wafer in one direction on which sections to be sliders each including a thin film magnetic head element are aligned in a plurality of rows. A bar-like magnetic head material (called 'bar' in the following description) on which the sections to be sliders are aligned in a row is thereby formed. Processing such as lapping is performed on the medium facing surface of the bar. The bar is then separated into the sliders.

In general, in order to stabilize the output characteristic of a magnetic head, it is important to maintain the distance between the magnetic pole and the surface of a recording medium at an extremely small specific value. It is therefore required in magnetic head processing that the flatness of the medium facing surface of the magnetic head precisely fall on a specific value so as to stabilize a flying amount and that the throat height and the MR height of the magnetic head fall within a specific range. The MR height is the length (height) between a medium-facing-surface-side end of the MR element and the other end. The throat height is the length (height) of the magnetic pole of an induction-type magnetic transducer.

There are several methods for lapping the medium facing surface so as to achieve desired values of the throat height and MR height of a magnetic head. A method generally used and achieving high precision is the method that utilizes a processing jig having functions described later and a lapping apparatus having a function of automatically lapping while applying an appropriate load to the jig and deforming a bar bonded to the jig.

The processing jig used in this method comprises a main body fixed to the lapping apparatus, a retainer that is long in one direction for retaining a bar, and a plurality of load application sections, coupled to the retainer, to which a load is applied for deforming the retainer. The shape of the retainer is a narrow and long beam that is bent with an application of external force. An external force being applied to the load application sections of the jig, the retainer is bent. The bending of the retainer causes bending of the bar held by the retainer.

A method of lapping a bar using the jig will now be described. In this method, the bar is fixed to the retainer of the jig with an adhesive and so on so that the surface of the bar to be lapped faces outside.

Next, the values of the throat height and MR height of each magnetic head in the bar fixed to the jig are determined through an optical or electrical method. The deviation of the determined values from the target values, that is, the amounts of lapping required, are calculated.

Of the sections to be lapped corresponding to the magnetic head elements in the bar, a section that requires a greater amount of lapping than the other sections needs to be more lapped. Therefore, the bar is deformed by applying a load to the load application sections so that the surface to be lapped of the section is made convex. On the other hand, a section that requires a smaller amount of lapping than the other sections needs to be less lapped. Therefore, the bar is deformed by applying a load to the load applied sections so that the surface to be lapped of the section is made concave. The bar is lapped by pressing the medium facing surface of the bar against a rotating lapping plate while the bar is deformed.

In such a manner, a series of operation is automatically repeated, including determining the throat height and the MR height of each magnetic head element, calculating the deviation of the determined values from the target values, that is, the amounts of lapping required, and lapping the bar while deforming the bar in accordance with the amounts of lapping required. Variations in the throat heights and the MR heights of the magnetic head elements are thereby modified. Finally, the throat heights and the MR heights of the magnetic head elements fall within a specific range.

A lapping apparatus for performing lapping of a bar as described above is disclosed in U.S. Pat. No. 5,620,356. A jig for lapping magnetic heads is disclosed in U.S. Pat. No. 5,607,340. A lapping control apparatus is disclosed in Published Unexamined Japanese Patent Application Heisei 2-95572 (1990) for controlling a throat height through observing a resistance of an MR element.

In a lapping method using a jig having three sections to which a load is applied for bending a retainer, as shown in U. S. Pat. No. 5,607,340 mentioned above, a lapping amount required is calculated based on the determined values of the throat height and the MR height. In accordance with the amount, a load for pushing or pulling is applied to the load application sections in a direction orthogonal to the length of the retainer so as to deform the retainer. The bar is lapped in this state so that the throat heights and the MR heights of the magnetic head elements fall within a permissible range.

Although highly precise throat heights and MR heights are more and more required, it is difficult for the lapping method described above to obtain the throat heights and MR heights within the permissible range throughout the length of the bar when the bar of about 50 mm in length, for example, is lapped.

The reasons will now be described. In the above-mentioned jig, a load for deforming the retainer is applied to the three load application points of the retainer in a direction orthogonal to the length of the retainer. The only shape of the retainer obtained through bending approximates to a curve of the fourth order. Consequently, modifiable distribution patterns of throat heights and MR heights are limited to the patterns that approximate to curves of a low order, that is, the fourth order or below. In contrast, although the values of throat heights and MR heights of most magnetic head elements in a bar actually lapped fall within the permissible range if seen in broad perspective, the distribution of the values of throat heights and MR heights of the magnetic head elements in the bar has a more complex pattern that may approximate to a curve of a high order such as a sixth order or above if seen in narrow perspective. As a result, correction of the throat heights and MR heights is not completely performed on the sections of the retainer that do not meet the distribution pattern of the throat heights and MR heights that may approximate to a curve of a high order as described above. The deviation of the determined values from the target values is not reduced, either. Therefore, some fall off the permissible range of the throat heights and MR heights.

Figure 10:
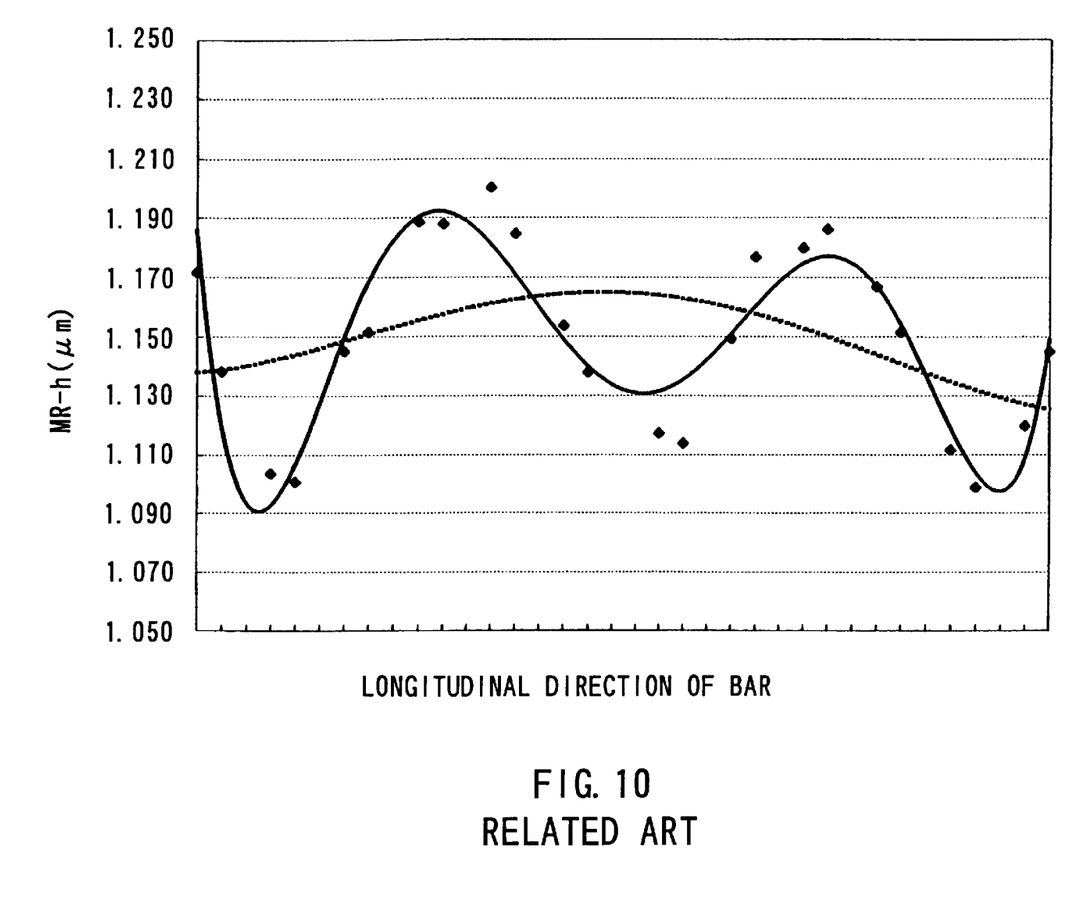
FIG. 10 shows an example of distribution of final MR heights in a bar when the bar is lapped with a jig of prior art.

FIG. 10 shows an example of the distribution of final MR heights 'MR-h' in a bar when the bar of about 50 mm in length, for example, is lapped with a jig of prior art while automatically controlling the throat heights and MR heights. The solid line indicates a regression curve of the sixth order of the distribution of MR heights 'MR-h'. The broken line indicates a regression curve of the fourth order of the distribution of MR heights 'MR-h'. In the example shown, the distribution of final MR heights 'MR-h' in the bar approximates to the regression curve of the sixth order.

Most distribution patterns of MR heights in a bar before lapping regress to curves of the sixth order or above. However, the prior-art jigs are capable of correcting distribution patterns of MR heights that approximate to curves of the fourth order or below only. Therefore, as shown in FIG. 10, high-order components remain uncorrected in the distribution pattern of MR heights in the bar after lapping. The same applies to the throat heights, too.

If a jig with a fewer (that is, one or two) points to which a load for bending is applied is used, distribution patterns of MR heights that approximate to curves of the still lower order are only correctable. As a result, with such a jig, more throat heights and MR heights fall outside the permissible range.

Several methods have been developed and improved for enhancing the straightness of a distribution pattern of throat heights and MR heights without forcedly deforming a jig. However, while the demand for higher-precision throat height and MR height specifications (a permissible range of ±0.01 $\mu$m, for example) is growing, it is extremely difficult to maintain the straightness of distribution pattern of throat heights and MR heights throughout the bar with such a high degree of accuracy. It is practically difficult as well to achieve accuracy of the flatness of the lapping surface of a lapping plate and the consistency of a lapping rate throughout the surface. Therefore, the method of controlling throat heights and MR heights without forcedly deforming a jig has limitations in terms of accuracy.

On the other hand, a method of reducing the length of a bar may be used for reducing variations in throat heights and MR heights in a bar. However, the number of magnetic heads processable at a time is reduced in this method. It is therefore required to increase the number of lapping apparatuses. Accordingly, productivity is reduced.

OBJECT AND SUMMARY OF THE INVENTION

It is an object of the invention to provide a jig, fixed to a processing apparatus, for retaining an object to be processed that is long in one direction, the jig being capable of deforming the object into a complicated shape and processing the object with accuracy.

A processing jig of the invention retains an object to be processed that is long in one direction. The jig is fixed to a processing apparatus for processing the object. The jig comprises: a main body to be fixed to the processing apparatus; a retainer that is long in one direction for retaining the object; a plurality of couplers for coupling the retainer and the main body to each other; and four load application sections or more to which a load is applied for deforming the retainer, the load application sections being coupled to the retainer.

The processing jig of the invention allows the object to be processed to be deformed into a more complicated shape, compared to a jig having only three load application sections.

In the processing jig of the invention, at least one of the load application sections may move in at least two of: a first linear direction; a second linear direction that extends at an angle to the first linear direction; and a rotational direction.

Other and further objects, features and advantages of the invention will appear more fully from the following description.

DETAILED DESCRIPTION OF THE PREFERRED EMBODIMENTS

Preferred embodiments of the invention will now be described in detail with reference to the accompanying drawings.

[First Embodiment]

Figure 6:
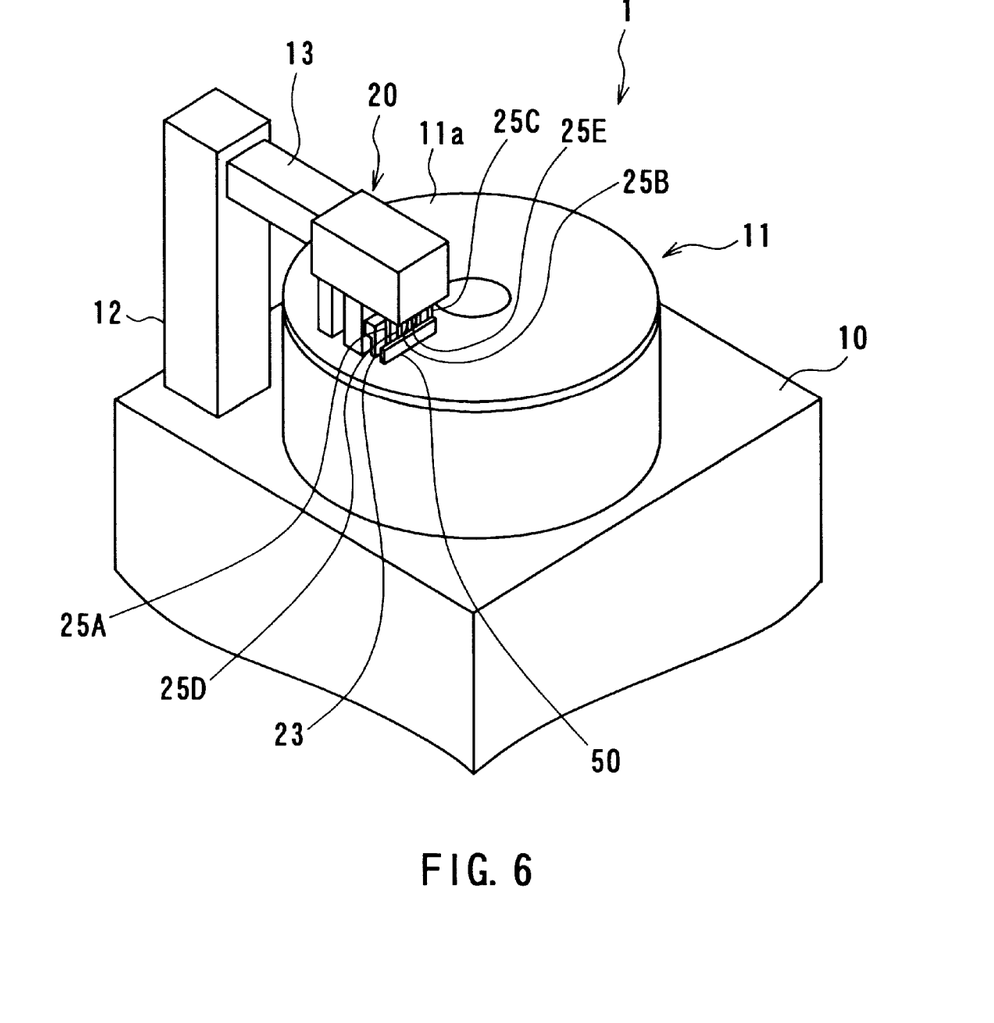
FIG. 6 is a schematic perspective view of a processing apparatus wherein the jig of the first embodiment is used.

Referring to FIG. 6, an example of a processing apparatus wherein a processing jig of a first embodiment of the invention is used will be first described. FIG. 6 is a schematic perspective view of the processing apparatus. The processing apparatus 1 is an apparatus for lapping a bar that is a magnetic head material in the shape of a bar in which sections to be sliders are arranged in a row. The processing apparatus 1 comprises: a table 10; a rotating lapping table 11 provided on the table 10; a strut 12 provided on the table 10 by the side of the rotating lapping table 11; and a material supporter 20 attached to the strut 12 through an arm 13. The rotating lapping table 11 has a lapping plate 11a to come to contact with a bar.

The material supporter 20 comprises a jig retainer 23 and five load application rods 25A to 25E placed in front of the jig retainer 23 with specific spacing. A processing jig (simply called 'jig' in the following description) 50 of this embodiment that holds the bar is to be fixed to the jig retainer 23.

Although not shown, the jig retainer 23 includes: a retainer body; a jig fixing pin projecting forward and placed in front of the retainer body near the lower end thereof in the middle of the horizontal length; and two guide pins as rotation preventing members projecting forward, each placed in front of the retainer body near the lower end thereof near each end of the horizontal length. The jig fixing pin has an internal thread in the tip thereof. The jig 50 is fixed to the jig fixing pin with a bolt as a fixture.

Load application pins (not shown) are provided at the lower ends of the load application rods 25A to 25E, respectively. Each of the load application rods 25A to 25E is driven in the vertical direction by an actuator not shown. Each of the load application pins is thereby driven in the vertical direction. Each of the load application pins may be driven in the horizontal direction, in addition to the vertical direction. Alternatively, each of the load application pins may be driven in three directions including vertical, horizontal and rotational directions.

Figure 1:
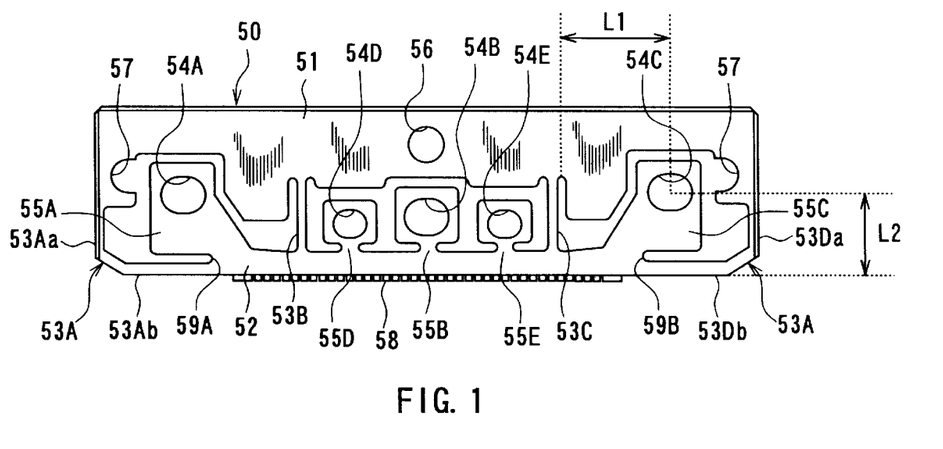
FIG. 1 is a front view of a jig of a first embodiment of the invention.
Figure 2:
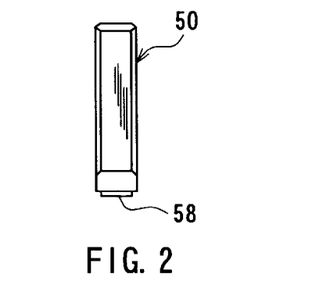
FIG. 2 is a right side view of the jig of the first embodiment of the invention.
Figure 3:
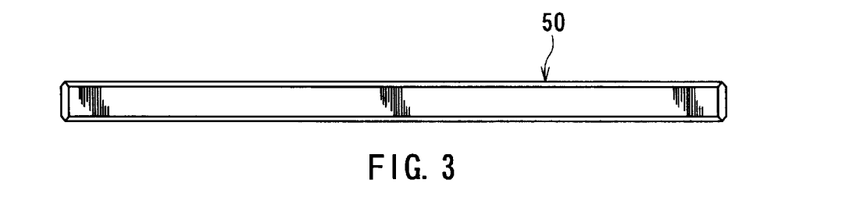
FIG. 3 is a top view of the jig of the first embodiment of the invention.
Figure 4:
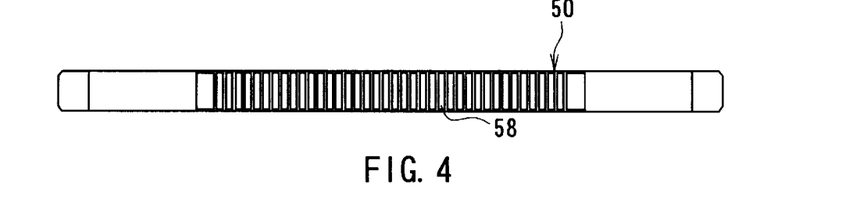
FIG. 4 is a bottom view of the jig of the first embodiment of the invention.

Referring to FIG. 1 to FIG. 4, the structure of the jig of this embodiment will now be described. FIG. 1 is a front view of the jig. FIG. 2 is a right side view of the jig. FIG. 3 is a top view of the jig. FIG. 4 is a bottom view of the jig.

As shown, the jig 50 of the embodiment comprises: a main body 51 to be fixed to the processing apparatus 1 shown in FIG. 6, for example; a retainer 52 that is long in one direction for retaining a bar that is an object long in one direction to be processed; four couplers 53A to 53D for coupling the retainer 52 to the main body 51; five load application sections 54A to 54E, coupled to the retainer 52, to which a load is applied for deforming the retainer 52; and arms 55A to 55E for coupling the retainer 52 to the load application sections 54A to 54E.

The main body 51 has a hole 56 for fixing as a fixing section in the middle of the length of the main body 51 and in a position above the middle of the vertical height of the main body 51. A bolt is inserted to the hole 56 for fixing the main body 51 to the jig fixing pin of the processing apparatus 1. The main body 51 further has two engaging sections 57 in which the two guide pins of the processing apparatus 1 are engaged. The engaging sections 57 are formed in positions that correspond to the guide pins when the hole 56 of the jig 50 is positioned to the jig fixing pin of the processing apparatus 1.

The shape of the retainer 52 is a narrow and long beam that is bent with an application of external force. At the lower end of the retainer 52, a bar fixing section 58 is provided to which a bar is fixed. The bar fixing section 58 has a plurality of grooves where a blade for cutting a bar enters.

The jig 50 may be made of stainless steel or a ceramic such as zirconia ($ZrO_2$) or alumina ($Al_2O_3$), for example.

In the embodiment, of the four couplers 53A to 53D, the two couplers 53A and 53D are called end couplers that couple the ends of the length of the retainer 52 to the main body 51. The two couplers 53B and 53C are called intermediate couplers that couple the retainer 52 to the main body 51 at points each between an end of the length of the retainer 52 and the middle of the retainer 52.

In the embodiment, the two load application sections 54A and 54C are each placed near each end of the length of the main body 51 and nearly in the middle of the vertical height of the main body 51. The load application section 54A is placed between the end coupler 53A and the intermediate coupler 53B. The load application section 54C is placed between the end coupler 53D and the intermediate coupler 53C.

The load application section 54B is placed in the middle of the length of the main body 51 and in a position below the middle of the vertical height of the main body 51. The load application section 54D is placed between the load application section 54B and the intermediate coupler 53B. The load application section 54E is placed between the load application section 54B and the intermediate coupler 53C.

The load application sections 54A to 54E are movable in three directions including: the vertical direction as a first linear direction; the horizontal direction as a second linear direction that extends at an angle to the first linear direction; and a rotational direction. Each of the load application sections 54A to 54E has a hole capable of receiving loads in the three directions including the vertical, horizontal and rotational directions. The cross section of the hole is other than a circle. In this embodiment, the cross section of the hole is oval-shaped.

The load application sections 54A to 54E may be movable only in the vertical direction, or only in two directions including the vertical and horizontal directions, or only in two directions including the vertical and rotational directions. Each of the load application sections 54A to 54E may have a hole that is circular in cross section if the load application sections 54A to 54E are movable only in the vertical direction, or only in two directions including the vertical and horizontal directions. Alternatively, some of the load application sections 54A to 54E may be only movable in a plurality of directions.

The two arms 55A and 55C on the sides each couple the retainer 52 to the load application sections 54A and 54C so that the centers of the load application sections 54A and 54C are shifted toward outside the length of the retainer 52 with respect to the centers of rotation 59A and 59B. The retainer 52 is deformed in the direction of rotation about the centers of rotation 59A and 59B by displacements of the load application sections 54A and 54C. That is, the arms 55A and 55C overhang toward outside the length of the retainer 52 with respect to the centers of rotation 59A and 59B.

Here, the direction of length (the horizontal direction) of the jig 50 is defined as the X direction. The direction orthogonal to the direction of length of the jig 50 and parallel to the front and back of the jig 50 (the vertical direction) is defined as the Y direction. As shown in FIG. 1, the distance between the center of the load application section 54A or 54C and the coupler 53B or 53C is called length L1 of the arm 55A or 55C in the X direction. The distance between the center of the load application section 54A or 54C and the lower end of the retainer 52 is called length L2 of the arms 55A or 55C in the Y direction.

Each of the couplers 53A to 53D is plate-shaped and flexible. One end of each of the couplers 53A to 53D is connected to the main body 51 and the other end of each of the couplers 53A to 53D is connected to the retainer 52. The end coupler 53A includes: a section 53A*a* extending in the vertical direction one end of which is connected to the main body 51; and a section 53A*b* extending in the horizontal direction one end of which is connected to the other end of the section 53A*a* and the other end of which is connected to one end of the retainer 52. Similarly, the end coupler 53D includes: a section 53D*a* extending in the vertical direction one end of which is connected to the main body 51; and a section 53D*b* extending in the horizontal direction one end of which is connected to the other end of the section 53D*a* and the other end of which is connected to the other end of the retainer 52. In this way, each of the end couplers 53A and 53D is plate-shaped, and a portion of each of the end couplers 53A and 53D extends from the other portion at an angle. Each of the intermediate couplers 53B and 53C is flat-plate-shaped.

Figure 5:
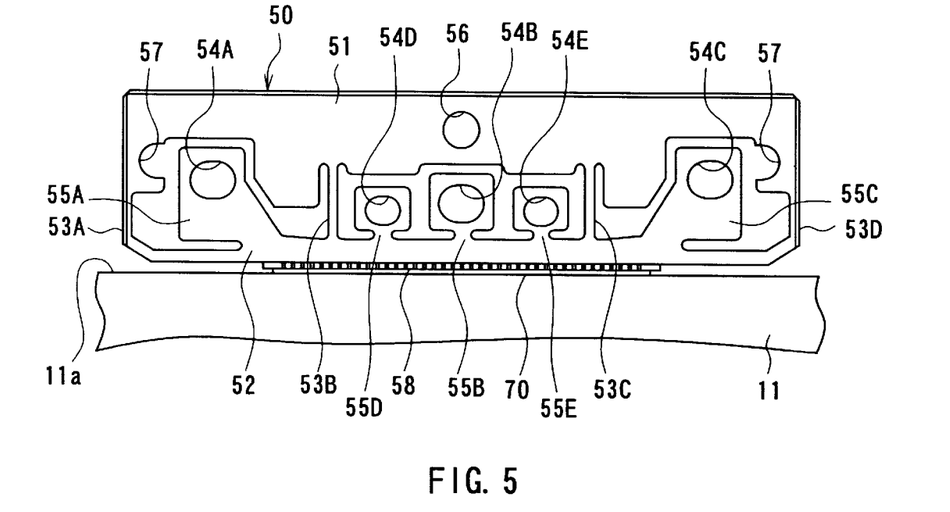
FIG. 5 is a front view of the jig of the first embodiment in use.

Referring to FIG. 5, the function of the jig 50 will now be described. FIG. 5 is a front view of the jig 50 in use. As shown, a bar 70 is fixed to the bar fixing section 58 of the jig 50 through bonding, for example, so that the medium facing surface of the bar 70 faces outside (faces downward). The jig 50 retaining the bar 70 is fixed to the processing apparatus 1 and placed such that the surface of the bar 70 to be processed comes to contact with the lapping plate 11a of the rotating lapping table 11. In this state, the load application pins of the processing apparatus 1 are driven in the vertical direction. A load in the vertical direction is thereby applied to each of the load application sections 54A to 54E of the jig 50. It is possible to apply loads in two or three directions to each of the load application sections 54A to 54E if the load application pins are driven in two directions including vertical and horizontal directions or in three directions including vertical, horizontal and rotational directions.

As thus described, the retainer 52, the bar fixing section 58 and the bar 70 are deformed by applying loads in various directions to the load application sections 54A to 54E of the jig 50. The medium facing surface of the bar 70 is thereby lapped while the throat heights and MR heights of the magnetic head elements in the bar 70 are controlled so that the target values are obtained.

Figure 7:
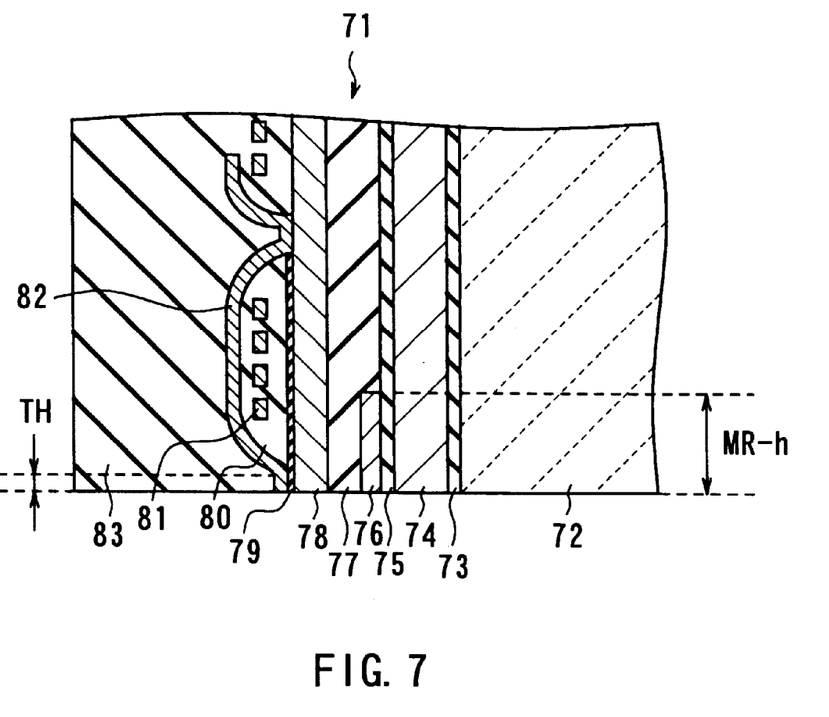
FIG. 7 is a cross section of an example of a magnetic head element.

The bar 70 is formed through cutting a wafer in one direction in which thin films are formed. The bar 70 includes a plurality of magnetic head elements arranged in a row. FIG. 7 shows a composite thin-film magnetic head as an example of a magnetic head element wherein an induction-type magnetic transducer for writing and an MR element for reading are stacked. A magnetic head element 71 of this example comprises a base film 73, a lower shield film 74, a lower insulating film 75, an MR element 76 and an upper insulating film 77, an upper-shield-cum-lower-magnetic-pole 78, a gap layer 79, an insulating layer 80 and a coil 81, an upper magnetic pole 82 and a protection film 83, each formed on a substrate (wafer) 72.

The substrate 72 is made of aluminum oxide and titanium carbide ($Al_2O_3$—TiC), for example. The base film 73, the lower insulating film 75, the upper insulating film 77, the protection film 83 and the gap layer 79 are made of alumina ($Al_2O_3$), for example. The lower shield film 74, the upper-shield-cum-lower-magnetic-pole 78 and the upper magnetic pole 82 are made of Permalloy (NiFe), for example. The insulating layer 80 is made of photoresist, for example. The coil 81 is made of Copper (Cu), for example.

The lower surface of the magnetic head element 71 in FIG. 7 is the surface to be lapped with the processing apparatus 1 shown in FIG. 6. While lapping, the processing apparatus 1 performs control such that throat height TH and MR height MR-h of every magnetic head element 71 included in the bar 70 fall within a certain limited tolerance. Such control is performed through observing the resistance values of an electrical lapping guide (ELG) and the MR element 76 as disclosed in Published Unexamined Japanese Patent Application Heisei 2-95572 (1990), for example. The electrical lapping guides are, for example, formed on the substrate 72 when the magnetic head element 71 is formed so as to be placed at both ends of the length of the bar 70.

Figure 8:
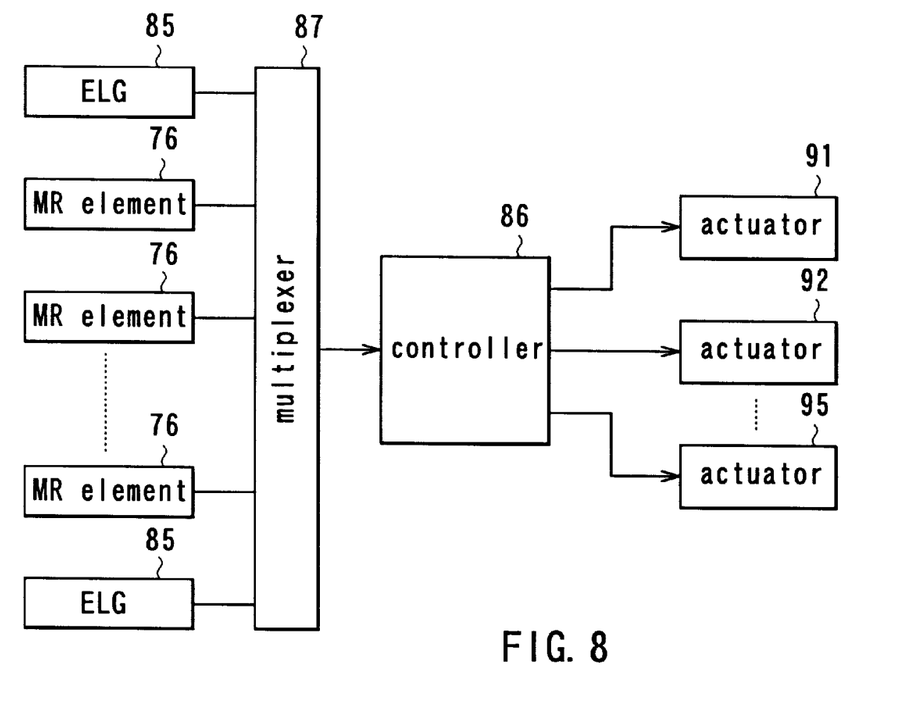
FIG. 8 is a block diagram showing an example of circuit configuration of the processing apparatus.

FIG. 8 is a block diagram showing an example of circuit configuration in a processing apparatus for controlling lapping by observing the resistance values of electrical lapping guides and MR elements as described above. The processing apparatus of this example comprises a controller 86 for controlling five actuators 91 to 95 for applying loads in the vertical direction to the load application sections 54A to 54E of the jig 50 through observing the resistance values of electrical lapping guides (ELG) 85 and the MR elements 76 in the bar 70; and a multiplexer 87, connected to the plurality of electrical lapping guides 85 and the MR elements 76 in the bar 70 through a connector (not shown), for selectively connecting one of the electrical lapping guides 85 and one of the MR elements 76 to the controller 86.

The number of actuators required is ten if loads in two directions are applied to the load application sections 54A to 54E. The number of actuators required is fifteen if loads in three directions are applied to the load application sections 54A to 54E.

In the processing apparatus, the controller 86 controls the actuators 91 to 95 through the multiplexer 87 by observing the resistance values of the electrical lapping guides 85 in the bar 70. The controller 86 first performs coarse control by observing the resistance values of the electrical lapping guides 85. The controller 86 then performs control by observing the resistance values of the MR elements 76 so that throat height TH and MR height MR-h of every magnetic head element 71 fall within a certain limited tolerance.

Before lapping the bar 70, although the distribution pattern of values of throat heights and MR heights of magnetic head elements in the bar 70 is a complicated pattern that may approximate to a curve of a high order, the throat heights and MR heights of the magnetic head elements throughout the bar 70 may fall within a permissible range with accuracy if it is possible to deform the retainer 52 of the jig 50 so as to faithfully follow the pattern.

However, the shape of the retainer that approximates to a curve of the fourth order is only obtained in the prior-art jig having three load application sections movable in vertical direction only.

In contrast, the jig 50 of this embodiment has the five load application sections 54A to 54E, so that the retainer 52 is deformed into a complicated shape that approximates to a curve of a high order of the sixth order or above. Therefore, the jig 50 of the embodiment allows the retainer 52 to be deformed with accuracy into a complicated shape conforming to the distribution pattern of throat heights and MR heights magnetic head elements in the bar. The bar is thereby lapped with accuracy. The throat heights and MR heights throughout the bar thus fall within a permissible range.

The retainer 52 is deformed into a more complicated shape if at least one of the load application sections 54A to 54E is moved in a plurality of directions.

The features of the arms of the jig 50 of this embodiment are as follows. One of the features of the arms is that length L2 in the Y direction of each of the arms 55A and 55C is long to some extent. In the embodiment, length L2 is about the same as length L1 in the X direction of each of the arms 55A and 55C. This feature of the arms 55A and 55C allows the retainer 52 to be easily deformed even if the load in the X direction applied to the load application sections 54A and 54C is small.

Another feature of the arms is that the arms 55A and 55C overhang toward outside the length of the retainer 52 with respect to the centers of rotation 59A and 59B. This structure has a function of adjusting bending near both ends of the retainer 52 so as to obtain a desired shape of the retainer 52. That is, in the retainer 52, since the section between the end coupler 53A and the intermediate coupler 53B and the section between the end coupler 53D and the intermediate coupler 53C are the twin-beam structures, the actual amounts of bending are short of the desired amounts near both ends of the retainer 52 close to the intermediate couplers 53B and 53C when a bending load is applied to the retainer 52. The overhanging arms 55A and 55C compensate the lack of amounts of bending near both ends of the retainer 52. That is, loads each applied to the load application sections 54A and 54C in the X or Y direction are transformed into moment loads about the centers of rotation 59A and 59B, respectively. The moment loads act on the neighborhood of both ends of the retainer 52 so as to increase the amounts of bending. As a result, the amounts of bending similar to those obtained with cantilevered structures are obtained in the section between the end coupler 53A and the intermediate coupler 53B and the section between the end coupler 53D and the intermediate coupler 53C of the retainer 52.

The features of the couplers of the jig 50 of the embodiment are as follows. One of the features of the couplers is that the intermediate couplers 53B and 53C have a flexible structure with respect to a bend in the retainer 52 since each of the intermediate couplers 53B and 53C is plate-shaped and flexible. The flexible structure is a structure that is flexible in response to an external force so as to be easily deformed and bent when an external force is applied and to recover its original shape when the external force is removed. As a result, the structure of the intermediate couplers 53B and 53C is unlikely to prevent deformations of the retainer 52 when a bending load is applied to the retainer 52. That is, since the intermediate couplers 53B and 53C are long and narrow, the retainer 52 is allowed to be shifted freely to some extent in the direction of rotation and in the X direction near the intermediate couplers 53B and 53C. An abnormal local bend in the retainer 52 near the intermediate couplers 53B and 53C is thereby prevented.

Another feature of the couplers is that, since each of the end couplers 53A and 53D is plate-shaped and flexible, the end couplers 53A and 53D have a flexible structure with respect to a bend in the retainer 52 while maintaining the torsional rigidity of the retainer 52 at a high value. The structure of the end couplers 53A and 53D therefore would not interfere with deformations of the retainer 52. During lapping, the retainer 52 is constantly under a load in the direction orthogonal to the front and rear surfaces of the jig 50 due to friction generated by the relative motion of the bar and the lapping plate. Since this load works in the direction twisting the retainer 52 and the amount is continuously varying, the load affects the flatness of the bar after lapping.

In the jig 50 of the embodiment, since the retainer 52 has a double-end support structure with the plate-shaped couplers 53A to 53D, the retainer 52 exhibits high rigidity in response to torsion. This structure is advantageous to improving the flatness of the bar. On the other hand, the end couplers 53A and 53D have a flexible structure with respect to a bend in the retainer 52 since the sections 53A$a$ and 53D$a$ extending in the vertical direction are long and thin and the sections 53A$b$ and 53D$b$ extending in the horizontal direction are thin as well in end couplers 53A and 53D. As a result, with an application of a bending load to the retainer 52, a bend that is similar to that obtained with a cantilevered structure is obtained.

With a double-end support beam structure wherein flexural rigidity at both ends is great, a bending amount obtained near both ends is little. Free deformations of the beam are thereby prevented. Therefore, it is difficult to control throat heights and MR heights with high accuracy with a jig of such a structure.

In contrast, the jig 50 of the embodiment exhibits high rigidity in response to torsion in the retainer 52 and has a flexible structure in response to a bend in the retainer 52. As a result, a bend that conforms to the distribution pattern of throat heights and MR heights is precisely obtained even near both ends of the bar while the flatness of the bar is maintained with enhanced accuracy.

Still another feature of the couplers is that, since the sections 53A$b$ and 53D$b$ extending in the horizontal direction of the end couplers 53A and 53D are thin and long to some extent, the end couplers 53A and 53D have a flexible structure with respect to a bend in the retainer 52, in combination with the sections 53A$a$ and 53D$a$ extending in the vertical direction that are thin and long to some extent and with the intermediate couplers 53B and 53C. This structure would not interfere with deformations of the retainer 52. As a result, with an application of a bending load to the retainer 52, a bend that is similar to that obtained with a cantilevered structure is obtained although the structure is actually a double-end support structure. A bend that conforms to the distribution pattern of throat heights and MR heights is thus precisely obtained even near both ends of the bar.

[Second Embodiment]

Figure 9:
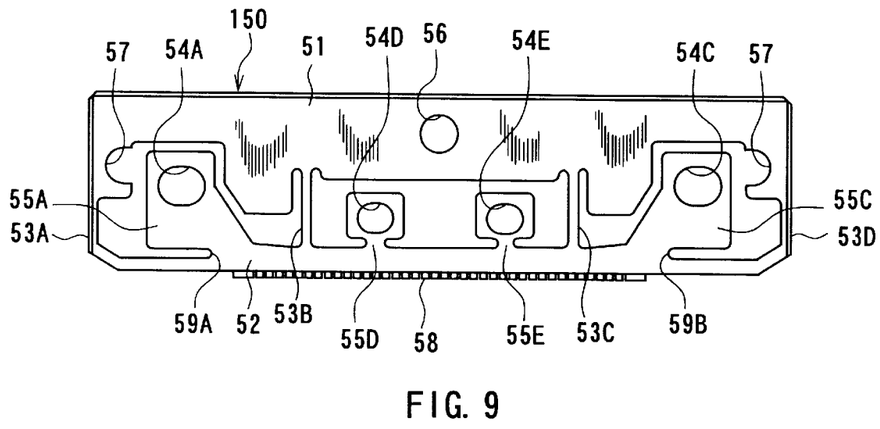
FIG. 9 is a front view of a jig of a second embodiment of the invention.

Reference is now made to FIG. 9 to describe a processing jig of a second embodiment of the invention. FIG. 9 is a front view of the jig 150 of the second embodiment. The jig 150 is similar to the jig 50 of the first embodiment except that the load application section 54B and the arm 55B are not provided. That is, the jig 150 has the four load application sections 54A, 54C, 54D and 54E.

The jig 150 of this embodiment allows the retainer 52 to be deformed into a complicated shape that approximates to a curve of the fifth order or above.

The remainder of configuration, functions and effects of the second embodiment are similar to those of the first embodiment.

The present invention is not limited to the foregoing embodiments but may be practiced in still other ways. For example, the processing jig of the invention may have six load application sections or more.

Although processing of composite thin-film magnetic heads each made up of layers of an induction-type magnetic transducer for writing and an MR element for reading is described in the foregoing embodiments, the invention is applicable to processing of thin-film magnetic heads each having an induction-type magnetic transducer for writing and reading.

The invention may be applied to any other processing such as polishing and grinding besides lapping.

The invention may be applied to processing of any object other than magnetic heads.

As described so far, the processing jig of the invention comprises four load application sections or more. As a result, an object to be processed that is long in one direction is deformed into a complicated shape, and the object is thereby processed with accuracy.

Obviously many modifications and variations of the present invention are possible in the light of the above teachings. It is therefore to be understood that within the scope of the appended claims the invention may be practiced otherwise than as specifically described.

What is claimed is:

1. A processing jig for retaining an object to be processed that is long in one direction, the jig being fixed to a processing apparatus for processing the object, the jig comprising:

a main body to be fixed to the processing apparatus;

a retainer that is long in one direction for retaining the object;

a plurality of couplers for coupling the retainer and the main body to each other; and four load application sections or more to which a load is applied for deforming the retainer, the load application sections being coupled to the retainer.

2. A processing jig according to claim 1 wherein at least one of the load application sections moves in at least two of: a first linear direction; a second linear direction that extends at an angle to the first linear direction; and a rotational direction.

* * * * *